United States Patent
Muramoto

(10) Patent No.: US 12,159,959 B2
(45) Date of Patent: Dec. 3, 2024

(54) METHOD FOR MANUFACTURING LIGHT-EMITTING ELEMENT

(71) Applicant: NICHIA CORPORATION, Anan (JP)

(72) Inventor: Eiji Muramoto, Tokushima (JP)

(73) Assignee: NICHIA CORPORATION, Anan (JP)

(*) Notice: Subject to any disclaimer, the term of this patent is extended or adjusted under 35 U.S.C. 154(b) by 589 days.

(21) Appl. No.: 17/539,521

(22) Filed: Dec. 1, 2021

(65) Prior Publication Data
US 2022/0199864 A1    Jun. 23, 2022

(30) Foreign Application Priority Data

Dec. 18, 2020    (JP) ................................ 2020-210180

(51) Int. Cl.
*H01L 33/44*    (2010.01)
*H01L 33/00*    (2010.01)
*H01L 33/32*    (2010.01)

(52) U.S. Cl.
CPC ............ *H01L 33/44* (2013.01); *H01L 33/007* (2013.01); *H01L 33/32* (2013.01); *H01L 2933/0025* (2013.01)

(58) Field of Classification Search
CPC ....... H01L 33/007; H01L 33/32; H01L 33/44; H01L 2933/0025
USPC ........................................................ 438/211
See application file for complete search history.

(56) References Cited

U.S. PATENT DOCUMENTS

| 6,828,179 | B2* | 12/2004 | Yamazaki ......... H01L 21/02675 438/149 |
| 2007/0184671 | A1 | 8/2007 | Yasuda et al. |
| 2011/0024781 | A1 | 2/2011 | Fujimoto et al. |
| 2013/0187183 | A1 | 7/2013 | Höppel et al. |

FOREIGN PATENT DOCUMENTS

| JP | 2005-019972 A | 1/2005 |
| JP | 2009-038319 A | 2/2009 |
| JP | 2011-035017 A | 2/2011 |
| JP | 2013-102192 A | 5/2013 |
| JP | 2013-115402 A | 6/2013 |
| JP | 2014-093509 A | 5/2014 |

* cited by examiner

*Primary Examiner* — Monica D Harrison
(74) *Attorney, Agent, or Firm* — Foley & Lardner LLP

(57) ABSTRACT

A method for manufacturing a light-emitting element includes: providing a semiconductor stacked body including a first semiconductor layer, an active layer, and a second semiconductor layer, formed in this order on a substrate; exposing a surface of the first semiconductor layer by removing the substrate; and forming a protective film on the surface of the first semiconductor layer by performing steps including: forming a first layer on the surface of the first semiconductor layer by chemical vapor deposition while introducing a source gas to a film formation chamber at a first flow rate, and forming a second layer on the first layer by chemical vapor deposition while introducing a source gas to the film formation chamber at a second flow rate, the second flow rate being less than the first flow rate.

20 Claims, 6 Drawing Sheets

METHOD FOR MANUFACTURING LIGHT-EMITTING ELEMENT

CROSS-REFERENCE TO RELATED APPLICATION

This application claims priority to Japanese Patent Application No. 2020-210180, filed on Dec. 18, 2020, the disclosure of which is hereby incorporated by reference in its entirety.

BACKGROUND

The present disclosure relates to a method for manufacturing a light-emitting element.

In a known light-emitting element that includes a semiconductor stacked body formed by stacking multiple semiconductor layers, a surface of a semiconductor layer used as a light extraction surface is covered with a protective film (e.g., see JP-A 2011-35017).

SUMMARY

However, the light extraction efficiency of the light-emitting element may decrease when a protective film is formed on the surface of the semiconductor layer. The inventor discovered that the major cause of the reduction of the light extraction efficiency is not optical absorption by the protective film, but alteration of the surface of the semiconductor layer when forming the protective film.

Based on this knowledge, certain embodiments of the present disclosure are directed to a method for manufacturing a light-emitting element in which light extraction efficiency can be increased while increasing moisture resistance of the semiconductor stacked body.

According to one embodiment, a method for manufacturing a light-emitting element includes providing a semiconductor stacked body, the semiconductor stacked body including a first semiconductor layer, an active layer, and a second semiconductor layer formed in this order on a substrate; exposing a surface of the first semiconductor layer by removing the substrate, and forming a protective film on the surface of the first semiconductor layer. The forming of the protective film includes forming a first layer on the surface of the first semiconductor layer by chemical vapor deposition while introducing a source gas of a first flow rate to a film formation chamber, and forming a second layer on the first layer by chemical vapor deposition while introducing a source gas of a second flow rate to the film formation chamber, the second flow rate being less than the first flow rate.

According to another embodiment, a method for manufacturing a light-emitting element includes providing a semiconductor stacked body, the semiconductor stacked body including a first semiconductor layer, an active layer, and a second semiconductor layer formed in this order on a substrate; exposing a surface of the first semiconductor layer by removing the substrate, and forming a protective film on the surface of the first semiconductor layer. The forming of the protective film includes forming a first layer on the surface of the first semiconductor layer by chemical vapor deposition while applying a first electrical power to the semiconductor stacked body side, and forming a second layer on the first layer by chemical vapor deposition while applying a second electrical power to the semiconductor stacked body side, the second electrical power being greater than the first electrical power.

According to another embodiment, a method for manufacturing a light-emitting element includes providing a semiconductor stacked body, the semiconductor stacked body including a first semiconductor layer, an active layer, and a second semiconductor layer formed in this order on a substrate; exposing a surface of the first semiconductor layer by removing the substrate, and forming a protective film on the surface of the first semiconductor layer. The forming of the protective film includes forming a first layer on the surface of the first semiconductor layer by chemical vapor deposition while applying a first pressure in a film formation chamber, and forming a second layer on the first layer by chemical vapor deposition while applying a second pressure in the film formation chamber, the second pressure being less than the first pressure.

Certain embodiments of the methods described in the present application may provide a light-emitting element in which light extraction efficiency can be increased while increasing moisture resistance of the semiconductor stacked body.

DETAILED DESCRIPTION

Figure 1:
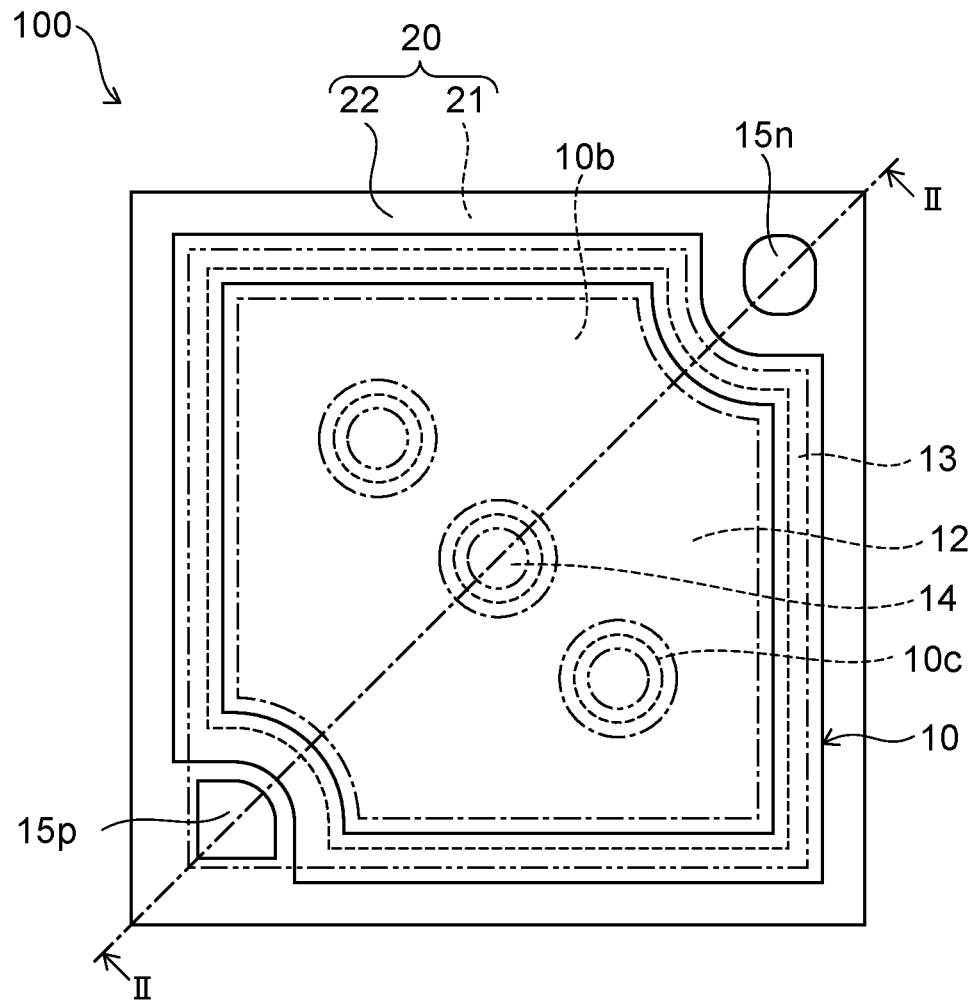
FIG. 1 is a schematic top view of a light-emitting element of a first embodiment.

Embodiments described below are examples embodying the technical ideas of the present disclosure, and the present invention is not limited to the described embodiments. The sizes, positional relationships, and the like of the members shown in the drawings may be exaggerated to clarify the description. The same or similar components are labeled with the same reference numerals, and a duplicate description is omitted as appropriate.

First Embodiment

FIG. 1 is a schematic top view of a light-emitting element 100 of a first embodiment.

Figure 2:
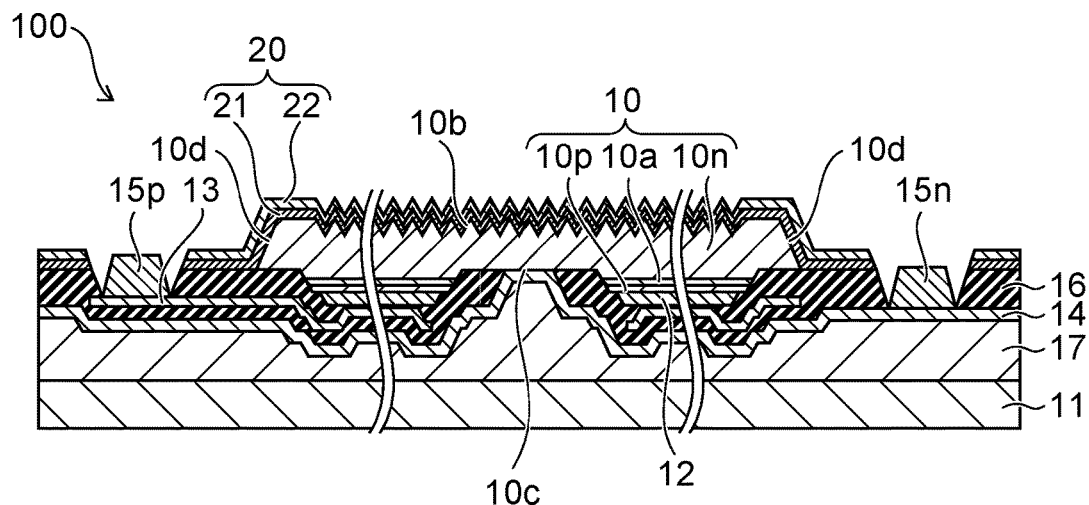
FIG. 2 is a cross-sectional view along line II-II of FIG. 1.

FIG. 2 is a schematic cross-sectional view of the light-emitting element 100 of the first embodiment, and is a cross-sectional view along line II-II of FIG. 1.

As shown in FIG. 2, the light-emitting element 100 includes a support member 11, a bonding layer 17, a semiconductor stacked body 10, a protective film 20, a reflecting electrode 12, first wiring 13, second wiring 14, a first pad electrode 15p, a second pad electrode 15n, and an insulating layer 16.

The semiconductor stacked body 10 includes a first semiconductor layer 10n, a second semiconductor layer 10p, and an active layer 10a positioned between the first semiconductor layer 10n and the second semiconductor layer 10p. According to the embodiment, the first semiconductor layer 10n is an n-side semiconductor layer, and the second semiconductor layer 10p is a p-side semiconductor layer.

The semiconductor stacked body 10 includes, for example, a nitride semiconductor such, as $In_xAl_yGa_{1-x-y}N$ ($0 \leq x$, $0 \leq y$, and $x+y \leq 1$), etc. For example, GaN, InGaN, AlGaN, AlInGaN, etc., are examples of the nitride semiconductor. The first semiconductor layer 10n and the second semiconductor layer 10p can have stacked structures that include multiple nitride semiconductor layers. The active layer 10a is a light-emitting layer that emits light. The active layer 10a can have a multi-quantum well structure that includes multiple barrier layers and multiple well layers in which the barrier layers and the well layers are alternately stacked. The light emission peak wavelength of the light emitted by the active layer 10a is, for example, not less than 300 nm and not more than 500 nm.

The reflecting electrode 12 that is light-reflective and conductive is located at a surface of the second semiconductor layer 10p. The first wiring 13 electrically connects the reflecting electrode 12 and the first pad electrode 15p, which is a connection portion to the outside.

The first semiconductor layer 10n includes a connection surface 10c that is not covered with the active layer 10a or the second semiconductor layer 10p, and on which the active layer 10a and the second semiconductor layer 10p are not stacked. The second wiring 14 electrically connects the connection surface 10c of the first semiconductor layer 10n and the second pad electrode 15n, which is a connection portion to the outside.

The insulating layer 16 is located between the first wiring 13 and the second wiring 14 and prevents an electrical connection between the first wiring 13 and the second wiring 14. An insulating material, such as $SiO_{A1}N_{B1}$ ($0 \leq A1$, $0 \leq B1$, and $0 < A1+B1$), A10A2NB2 ($0 \leq A2$, $0 \leq B2$, and $0 < A2+B2$), or the like, can be used as the material of the insulating layer 16. The insulating layer 16 may have a single-layer structure of a layer made of these insulating materials or a stacked structure in which multiple layers are stacked.

The light from the active layer 10a is extracted outside the semiconductor stacked body 10 mainly through a surface 10b of the first semiconductor layer 10n. The active layer 10a, the second semiconductor layer 10p, and the connection surface 10c are positioned at the surface of the first semiconductor layer 10n positioned at the side opposite to the surface 10b of the first semiconductor layer 10n. The surface 10b of the first semiconductor layer 10n includes an uneven surface on which surface roughening is performed. The arithmetic average roughness of the uneven surface of the first semiconductor layer 10n is, for example, not less than 0.1 μm and not more than 5 μm.

The reflecting electrode 12 performs the role of increasing the light extraction efficiency by reflecting, toward the surface 10b side of the first semiconductor layer 10n, the light toward the second semiconductor layer 10p side from the active layer 10a. The reflecting electrode 12 is electrically connected to the second semiconductor layer 10p and performs the role of supplying electrical power to the second semiconductor layer 10p. From this perspective, it is favorable for the reflecting electrode 12 to include a highly light-reflective metal material. A metal material, such as Ag, Al, Rh, Ni, Ti, Pt, or the like, an alloy that includes such a metal material as a major component, etc., can be used as the metal material of the reflecting electrode 12. The reflecting electrode 12 may have a single-layer structure of a layer made of these metal materials or a stacked structure in which multiple layers are stacked. The highly light-reflective metal material is, for example, a metal material that has a reflectance that is not less than 70%, and favorably not less than 80% for the light emission peak wavelength of the light emitted by the active layer 10a.

The first wiring 13 is electrically connected to the reflecting electrode 12 and is wiring for supplying the electrical power supplied to the first pad electrode 15p from the outside to the second semiconductor layer 10p via the reflecting electrode 12. A metal material, such as Al, Rh, Ag, Ti, Pt, Au, Cu, Si, or the like, a semiconductor material, or an alloy that includes such a material as a major component can be used as the material of the first wiring 13. The first wiring 13 may have a single-layer structure of a layer made of these metal materials or a stacked structure in which multiple layers are stacked.

The second wiring 14 is electrically connected to the connection surface 10c of the first semiconductor layer 10n and is wiring for supplying the electrical power supplied to the second pad electrode 15n from the outside to the first semiconductor layer 10n. A metal material, such as Al, Rh, Ag, Ti, Pt, Au, Cu, Si, Ni, Sn, or the like, a semiconductor material, or an alloy that includes such a material as a major component can be used as the material of the second wiring 14. The second wiring 14 may have a single-layer structure of a layer made of these metal materials or a stacked structure in which multiple layers are stacked.

Metal wires, etc., are connected to the first pad electrode 15p and the second pad electrode 15n as appropriate. A metal material, such as Au, Rh, Pt, Ti, or the like, or an alloy that includes such a metal material as a major component can be used as the materials of the first pad electrode 15p and the second pad electrode 15n. The first pad electrode 15p and the second pad electrode 15n may have a single-layer structure of a layer made of these metal materials or a stacked structure in which multiple layers are stacked.

The bonding layer 17 is located between the support member 11 and the second wiring 14 and bonds the support member 11 and the second wiring 14. A metal material, such as Au, Sn, Ni, In, Pb, Sb, Bi, Cu, Ag, or the like, or an alloy that includes such a metal material as a major component can be used as the material of the bonding layer 17.

The support member 11 is bonded to the semiconductor stacked body 10 and the other members described above via the bonding layer 17 and performs the role of mechanically or physically supporting these components. A semiconductor material, such as CuW, Si, Mo, CuMo, or the like, or a metal material can be used as the material of the support member 11.

The protective film 20 is located at the surface 10b of the first semiconductor layer 10n and covers the entire surface of the surface 10b. The protective film 20 is located also at a side surface 10d of the semiconductor stacked body 10 exposed at the insulating layer 16, and the protective film 20 covers the side surface 10d. The protective film 20 also covers the upper surface of the insulating layer 16.

There are cases where the semiconductor stacked body 10 degrades due to moisture existing in ambient air, etc., and such degradation may cause the reliability of the light-emitting element 100 to decrease. The protective film 20 is provided to protect the semiconductor stacked body 10 from such moisture and performs the role of suppressing penetration of the moisture to, for example, the active layer 10a, the interface between the second semiconductor layer 10p and the reflecting electrode 12, and the interface between the first semiconductor layer 10n and the second wiring 14. In particular, when the first semiconductor layer 10n is made of a nitride semiconductor, and if the surface 10b of the first semiconductor layer 10n is a nitrogen surface terminated with nitrogen, the nitrogen surface easily oxidizes; therefore, it is desirable to ensure the moisture resistance by forming the protective film 20.

For example, the moisture penetrates through the interface between the semiconductor stacked body 10 and the insulating layer 16, etc. For example, discrepancies that occur due to moisture include degradation of the semiconductor stacked body 10, migration of the metal material included in the reflecting electrode 12, etc. Therefore, it is favorable for the protective film 20 to cover the side surface 10d of the semiconductor stacked body 10.

The protective film 20 includes a first layer 21 and a second layer 22. The first layer 21 is continuous on the surface 10b of the first semiconductor layer 10n, the side surface 10d, and the upper surface of the insulating layer 16 and covers the surface 10b of the first semiconductor layer 10n, the side surface 10d, and the upper surface of the insulating layer 16. The second layer 22 is located on the first layer 21 and covers the first layer 21.

The thickness of the first layer 21 is less than the thickness of the second layer 22. The density of the first layer 21 is less than the density of the second layer 22. For example, the first layer 21 is a silicon oxide film. For example, the second layer 22 is a silicon oxide film or an aluminum nitride film.

FIGS. 3 to 9 are cross-sectional views schematically illustrating a method for manufacturing the light-emitting element 100 of the first embodiment. The method for manufacturing the light-emitting element 100 of the first embodiment will now be described using FIGS. 3 to 9.

Figure 3:
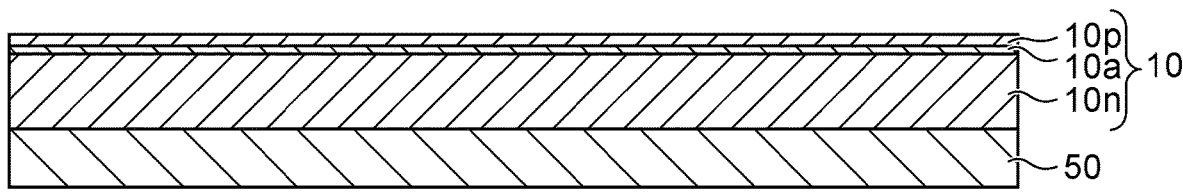
FIGS. 3 to 9 are cross-sectional views schematically illustrating a method for manufacturing the light-emitting element of the first embodiment.

First, as shown in FIG. 3, the semiconductor stacked body 10 in which the first semiconductor layer 10n, the active layer 10a, and the second semiconductor layer 10p are formed in this order on a substrate 50 is provided. For example, the semiconductor stacked body 10 is provided by forming the first semiconductor layer 10n, the active layer 10a, and the second semiconductor layer 10p in this order on the substrate 50 by MOCVD (Metal Organic Chemical Vapor Deposition).

For example, a buffer layer that is made of AlGaN may be formed before forming the first semiconductor layer 10n on the substrate 50. For example, a sapphire substrate can be used as the substrate 50. For example, the first semiconductor layer 10n is formed to have a thickness that is not less than 1 μm and not more than 5 μm. For example, the active layer 10a is formed to have a thickness that is not less than 100 nm and not more than 300 nm. For example, the second semiconductor layer 10p is formed to have a thickness that is not less than 100 nm and not more than 300 nm.

Figure 4:
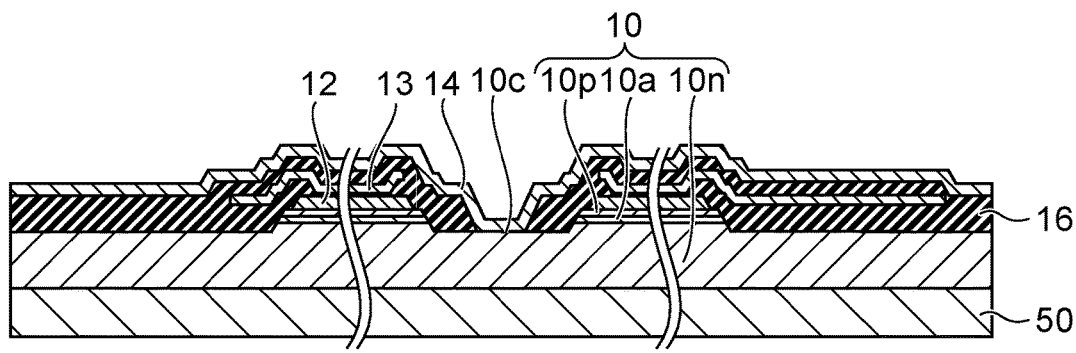

Then, as shown in FIG. 4, the reflecting electrode 12 is formed by sputtering, etc., on a portion of the upper surface of the second semiconductor layer 10p. After forming the reflecting electrode 12, the connection surface 10c is formed by exposing a portion of the first semiconductor layer 10n from under the second semiconductor layer 10p and the active layer 10a by partially etching the semiconductor stacked body 10. The etching of the semiconductor stacked body 10 is performed by, for example, dry etching, such as RIE (Reactive Ion Etching), etc.

Continuing, an insulating member that includes an opening at a portion of the upper surface of the reflecting electrode 12 is formed using CVD (Chemical Vapor Deposition), etc. Then, the first wiring 13 that is located at the upper surface of the insulating member and is connected to the reflecting electrode 12 is formed by sputtering, etc. Then, an insulating member is formed on the upper surface of the first wiring 13. Then, an opening is formed to expose a portion of the connection surface 10c of the first semiconductor layer 10n from under the insulating member by etching a portion of the insulating member by dry etching, etc. The insulating layer 16 that includes openings that expose portions of the reflecting electrode 12 and the connection surface 10c is formed by the processes of forming these insulating members. Then, the second wiring 14 that is located at the upper surface of the insulating layer 16 and is connected to the connection surface 10c is formed by sputtering, etc. Here, the formation of the members is performed by patterning using photolithography, etching, and lift-off as appropriate.

Figure 5:
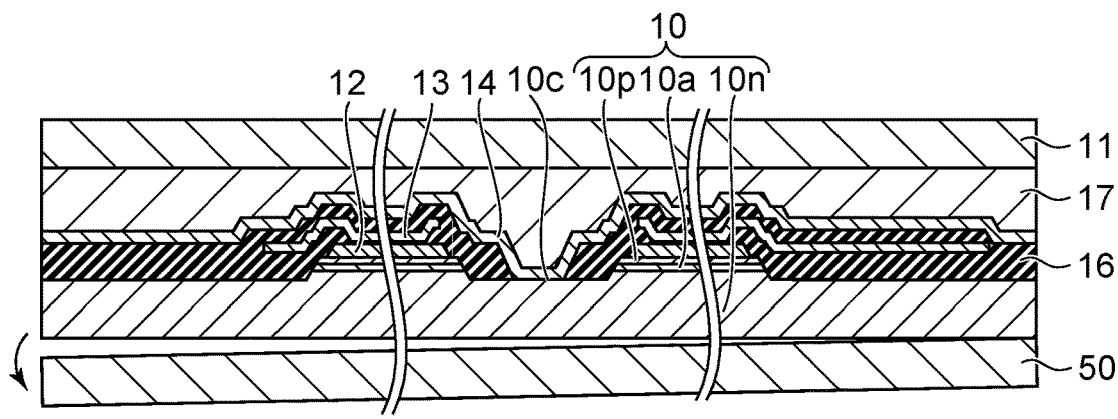

Then, as shown in FIG. 5, the support member 11 is provided, and the support member 11 and the second wiring 14 are bonded via the bonding layer 17. The bonding layer 17 may be located only at one of the support member 11 side or the second wiring 14 side, or may be located at both. The bonding that uses the bonding layer 17 is performed according to the material included in the bonding layer 17, and is performed by heating the substrate 50 and the support member 11 to about 100° C. to 350° C. and by applying a load of about 1 MPa to 20 MPa.

Continuing, the substrate 50 is detached or removed by a method such as LLO (Laser Lift Off), polishing, etching, etc. According to the embodiment, the substrate 50 is a sapphire substrate; therefore, it is favorable for the substrate 50 to be detached by LLO. The surface 10b of the first semiconductor layer 10n is exposed by detaching the substrate 50.

Figure 6:
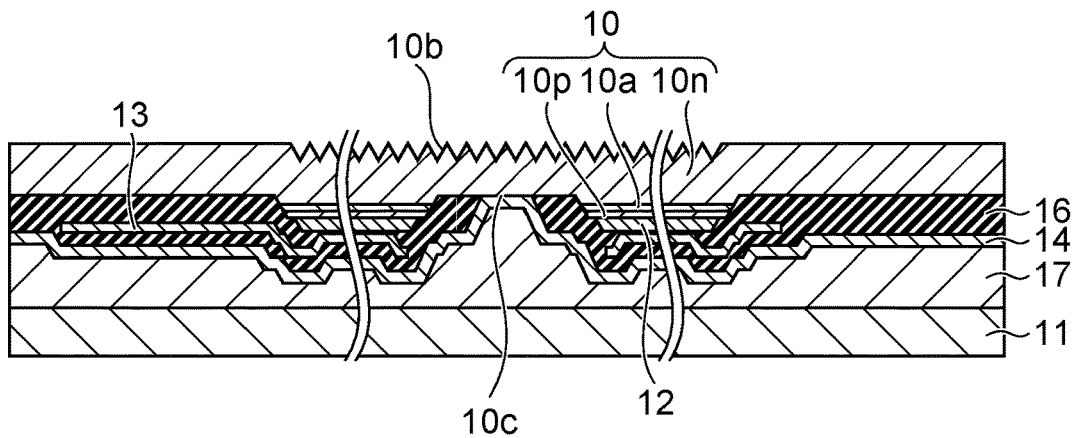

As shown in FIG. 6, an uneven surface is formed in the exposed surface 10b of the first semiconductor layer 10n by surface roughening the surface 10b. The light extraction efficiency of the light-emitting element can be increased by forming the uneven surface in the surface 10b that is the major extraction surface of the light. For example, the surface 10b is roughened by wet etching using an alkaline solution, such as TMAH, etc., and by using a mask that includes an opening in the region where the surface 10b is to be roughened. As the mask material, it is favorable to use a material such as $SiO_2$ or the like that is not easily dissolved by the alkaline solution that is used.

Figure 7:
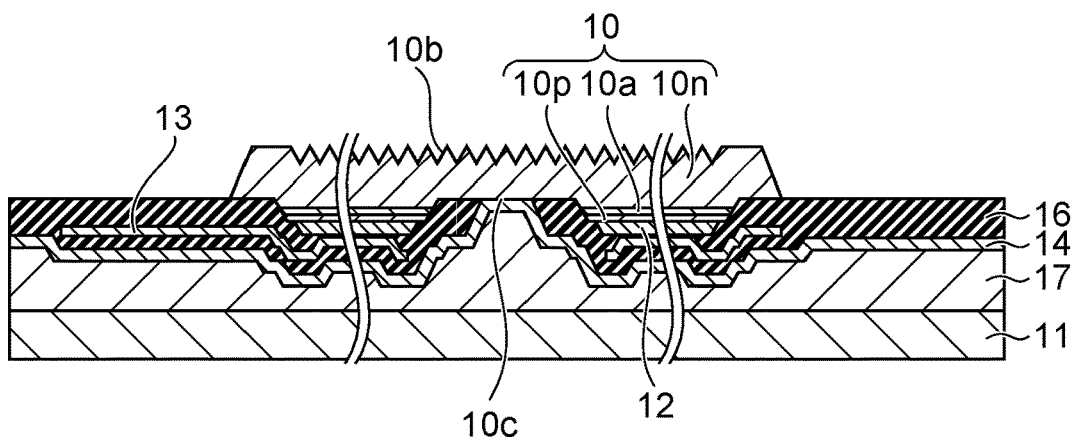

After roughening the surface 10b of the first semiconductor layer 10n, a portion of the insulating layer 16 is exposed by etching a portion of the first semiconductor layer 10n positioned on the insulating layer 16 as shown in FIG. 7. The semiconductor stacked body 10 that was continuous on the insulating layer 16 is divided into multiple semiconductor parts. For example, the first semiconductor layer 10n is etched by dry etching using a mask on the first semiconductor layer 10n that is substantially rectangular when viewed in top-view to cover the multiple semiconductor parts.

Then, the protective film 20 is formed at the surface 10b of the first semiconductor layer 10n. The process of forming the protective film 20 includes the process of forming the first layer 21 and the process of forming the second layer 22.

Figure 8:
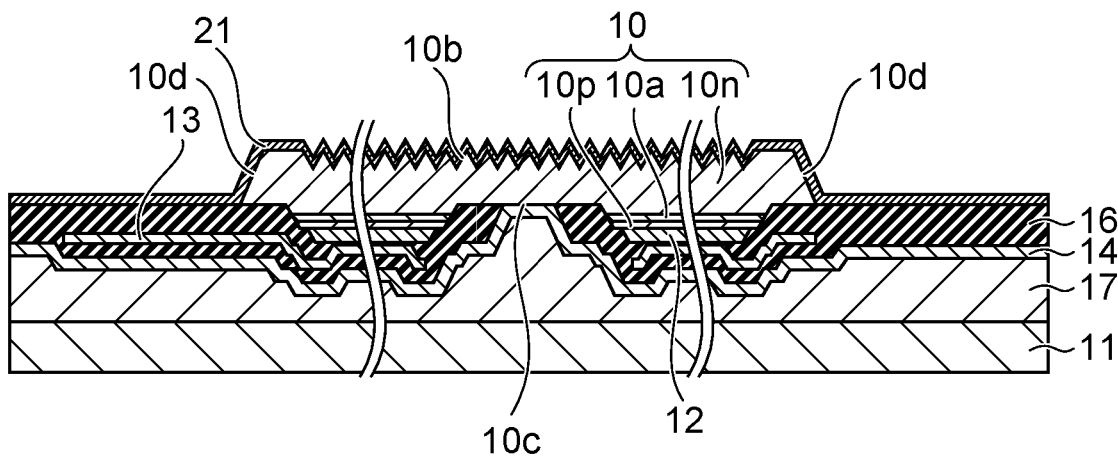

First, as shown in FIG. 8, the first layer 21 is formed at the surface 10b of the first semiconductor layer 10n to cover the uneven surface. The first layer 21 is formed also at the side surface 10d of the first semiconductor layer 10n and the upper surface of the insulating layer 16.

Figure 9:
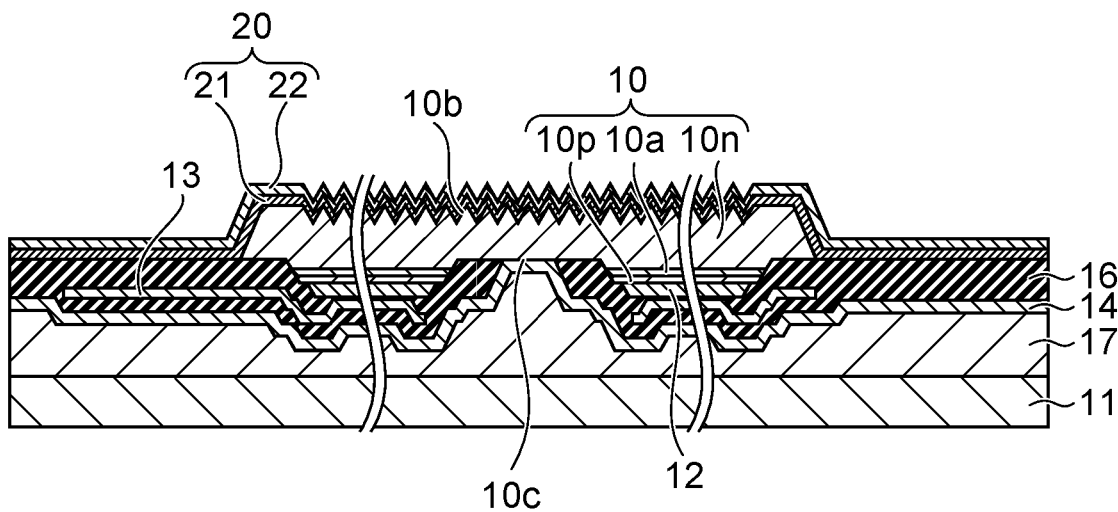

After forming the first layer 21, the second layer 22 is formed on the first layer 21 as shown in FIG. 9. The second layer 22 covers the entire surface of the first layer 21.

The first layer 21 and the second layer 22 are formed by chemical vapor deposition (CVD). For example, silicon oxide films are formed as the first and second layers 21 and 22 by plasma CVD or thermal CVD using a source gas including TEOS (tetraethyl orthosilicate).

The energy of the atoms deposited onto the surface 10b of the first semiconductor layer 10n is less when forming the first layer 21 than when forming the second layer 22. By reducing the energy when forming the first layer 21, the formation of an altered layer in the surface 10b of the first semiconductor layer 10n can be suppressed.

When forming the first layer 21, a source gas of a first flow rate is introduced to a film formation chamber; a first electrical power is applied to the semiconductor stacked body 10 side, and the pressure in the film formation chamber is set to a first pressure.

When forming the second layer 22, a source gas of a second flow rate that is less than the first flow rate is introduced to the film formation chamber, a second electrical power that is greater than the first electrical power is applied to the semiconductor stacked body 10 side, and the pressure in the film formation chamber is set to a second pressure that is less than the first pressure.

By setting the first flow rate when forming the first layer 21 to be greater than the second flow rate when forming the second layer 22, collisions between the atoms in the film formation chamber can be greater when forming the first layer 21 than when forming the second layer 22. Direct collisions with the surface 10b of the first semiconductor layer 10n of the film components when forming the first layer 21 are reduced thereby. As a result, the damage to the surface 10b of the first semiconductor layer 10n can be reduced, and the alteration of the surface 10b of the first semiconductor layer 10n can be suppressed. For example, it is favorable for the first flow rate to be not less than 2 times the second flow rate. For example, the first flow rate of TEOS gas when forming the first layer 21 can be not less than 18 sccm and not more than 22 sccm, and the second flow rate of TEOS gas when forming the second layer 22 can be not less than 6 sccm and not more than 10 sccm.

By setting the first electrical power when forming the first layer 21 to be less than the second electrical power when forming the second layer 22, the acceleration force of the atoms toward the semiconductor stacked body 10 side can be weaker when forming the first layer 21 than when forming the second layer 22. The damage to the surface 10b of the first semiconductor layer 10n can be reduced thereby, and the alteration of the surface 10b of the first semiconductor layer 10n can be suppressed. For example, it is favorable for the first electrical power to be not more than 0.5 times the second electrical power. For example, the first electrical power when forming the first layer 21 can be not less than 45 W and not more than 55 W, and the second electrical power when forming the second layer 22 can be not less than 180 W and not more than 220 W.

By setting the first pressure when forming the first layer 21 to be greater than the second pressure when forming the second layer 22, the collisions between the atoms in the film formation chamber can be greater when forming the first layer 21 than when forming the second layer 22. The direct collisions with the surface 10b of the first semiconductor layer 10n of the film components when forming the first layer 21 are reduced thereby. As a result, the damage to the surface 10b of the first semiconductor layer 10n can be reduced, and the alteration of the surface 10b of the first semiconductor layer 10n can be suppressed. For example, it is favorable for the first pressure to be not less than 2 times the second pressure. For example, the first pressure when forming the first layer 21 can be not less than 180 Pa and not more than 220 Pa, and the second pressure when forming the second layer 22 can be not less than 60 Pa and not more than 100 Pa.

By forming the first layer 21 to satisfy at least one condition of the three conditions of the relationship between the first flow rate and the second flow rate, the relationship between the first electrical power and the second electrical power, and the relationship between the first pressure and the second pressure described above, the damage to the surface 10b of the first semiconductor layer 10n can be reduced, and the alteration of the surface 10b of the first semiconductor layer 10n can be suppressed.

Compared to when the first layer 21 is formed to satisfy only one of the three conditions described above, the damage to the surface 10b of the first semiconductor layer 10n can be reduced and the alteration of the surface 10b of the first semiconductor layer 10n can be suppressed by satisfying two conditions of the three conditions. Furthermore, compared to when the first layer 21 is formed to satisfy only two of the three conditions, the damage to the surface 10b of the first semiconductor layer 10n can be reduced and the alteration of the surface 10b of the first semiconductor layer 10n can be suppressed by satisfying all three conditions.

The time that the surface 10b of the first semiconductor layer 10n is damaged is proportional to the film formation time of the first layer 21, and the film formation time of the first layer 21 is proportional to the thickness of the first layer 21. Accordingly, it is favorable for the thickness of the first layer 21 to be less than the thickness of the second layer 22. For example, it is favorable for the thickness of the first layer 21 to be not less than 10 nm and not more than 50 nm.

To increase the moisture resistance of the semiconductor stacked body 10, it is favorable for the thickness of the second layer 22 to be greater than the thickness of the first layer 21. For example, the thickness of the second layer 22 is not less than 100 nm and not more than 2000 nm. More favorably, the thickness of the second layer 22 is not less than 600 nm and not more than 2000 nm. Also, it is favorable for the second layer 22 to have a higher density than the first layer 21.

According to the embodiment, the moisture resistance due to the second layer 22 can be increased while the first layer 21 suppresses the formation of the altered layer in the surface 10b of the first semiconductor layer 10n. Accordingly, the light extraction efficiency can be increased while increasing the moisture resistance of the semiconductor stacked body 10.

The light output when forming the silicon oxide film on the surface 10b of the first semiconductor layer 10n at a flow rate of TEOS gas of 20 sccm was about 2.9% greater than the light output when forming the silicon oxide film on the surface 10b of the first semiconductor layer 10n at a flow rate of TEOS gas of 8 sccm.

The light output when forming the silicon oxide film on the surface 10b of the first semiconductor layer 10n at an electrical power of 50 W was about 3.9% greater than the light output when forming the silicon oxide film on the surface 10b of the first semiconductor layer 10n at an electrical power of 200 W.

The light output when forming the silicon oxide film on the surface 10b of the first semiconductor layer 10n at a pressure of 200 Pa was about 1.8% greater than the light output when forming the silicon oxide film on the surface 10b of the first semiconductor layer 10n at the pressure of 80 Pa.

The interior of the film formation chamber when forming the first layer 21 can be set to a first frequency, and the interior of the film formation chamber when forming the second layer 22 can be set to a second frequency that is less than the first frequency. The first layer 21 and the second layer 22 are formed by CVD. The first frequency is, for example, not less than 12 MHz and not more than 15 MHz. The second frequency is, for example, not less than 300 kHz and not more than 500 kHz.

By setting the first frequency when forming the first layer 21 to be greater than the second frequency when forming the second layer 22, the atoms are more difficult to accelerate when forming the first layer 21 than when forming the second layer 22. The damage to the surface 10b of the first semiconductor layer 10n when forming the first layer 21 can be reduced thereby, and the alteration of the surface 10b of the first semiconductor layer 10n can be suppressed.

The light output when forming the silicon oxide film on the surface 10b of the first semiconductor layer 10n by setting the frequency in the film formation chamber to about 13 MHz was about 3.2% greater than the light output when forming the silicon oxide film on the surface 10b of the first semiconductor layer 10n by setting the frequency in the film formation chamber to about 380 kHz.

The first layer 21 can be formed by ALD (Atomic Layer Deposition), and the second layer 22 can be formed by CVD. By forming the first layer 21 using ALD, the formation of the altered layer of the surface 10b of the first semiconductor layer 10n can be suppressed more than when the first layer 21 is formed using CVD at the same conditions as the second layer 22.

After forming the protective film 20, the first pad electrode 15p and the second pad electrode 15n shown in FIG. 2 are formed. First, a first opening that exposes the first wiring 13 and a second opening that exposes the second wiring 14 are formed in a portion of the protective film 20 and a portion of the insulating layer 16 that are positioned at regions of the periphery of the semiconductor stacked body 10. The first pad electrode 15p is formed in the first opening to connect with the first wiring 13. The second pad electrode 15n is formed in the second opening to connect with the second wiring 14.

Subsequently, the support member 11 is patterned to have a prescribed thickness as appropriate. For example, the patterning of the support member 11 is performed by polishing, grinding, or the like at the surface of the support member 11 at which the bonding layer 17 is not located. Subsequently, for example, multiple light-emitting elements are singulated by laser dicing and/or blade dicing.

Second Embodiment

Figure 10:
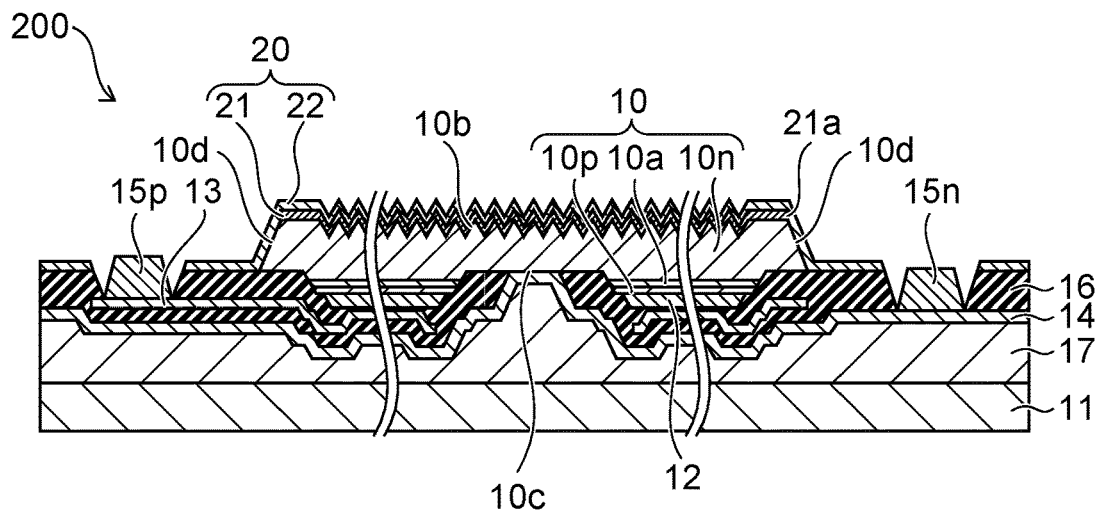
FIG. 10 is a schematic cross-sectional view of a light-emitting element of a second embodiment.

FIG. 10 is a schematic cross-sectional view of a light-emitting element 200 of a second embodiment. FIG. 10 is a cross section similar to FIG. 2.

In the light-emitting element 200 of the second embodiment, the first layer 21 of the protective film 20 is located at the surface 10b of the first semiconductor layer 10n but is not located at the side surface 10d of the semiconductor stacked body 10 or the upper surface of the insulating layer 16.

The second layer 22 is located at on the first layer 21 and the upper surface of the insulating layer 16 to cover an end portion 21a of the first layer 21 and the side surface 10d of the semiconductor stacked body 10.

FIGS. 11 to 14 are schematic cross-sectional views illustrating a method for manufacturing the light-emitting element 200 of the second embodiment.

Figure 11:
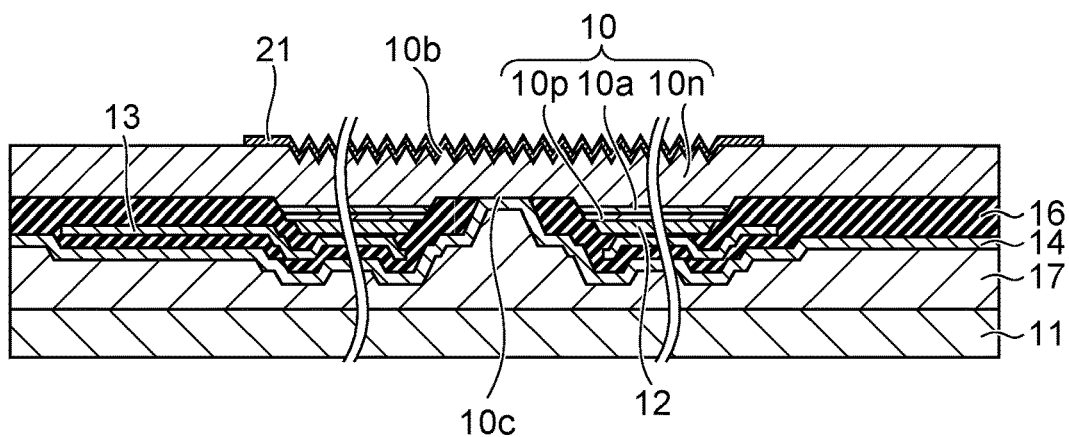
FIGS. 11 to 14 are cross-sectional views schematically illustrating a method for manufacturing the light-emitting element of the second embodiment.

After removing the substrate 50 used to grow the semiconductor stacked body 10 and after forming the uneven surface in the surface 10b of the first semiconductor layer 10n, the first layer 21 is formed on the surface 10b of the first semiconductor layer 10n to cover the uneven surface as shown in FIG. 11. The first layer 21 is formed on a portion of the surface 10b that includes the uneven surface, and is not formed on the entire surface of the surface 10b of the first semiconductor layer 10n.

Figure 12:
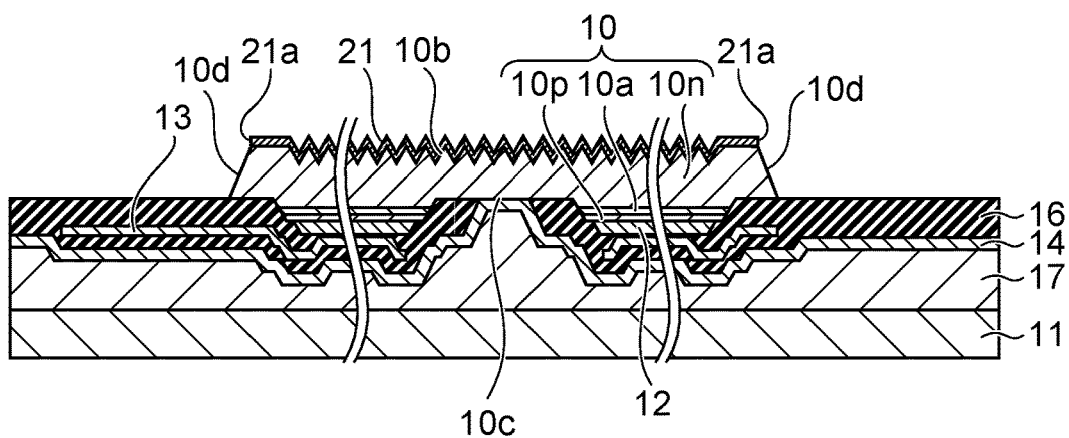

After forming the first layer 21, a portion of the first semiconductor layer 10n positioned on the insulating layer 16 is etched as shown in FIG. 12. Thereby, the semiconductor stacked body 10 that was continuous on the insulating layer 16 is divided into multiple semiconductor parts. The side surface 10d of the semiconductor stacked body 10 is formed by dividing the semiconductor stacked body 10 into the multiple semiconductor parts. Although the end portion 21a of the first layer 21 is formed along the outer edge of the surface 10b of the first semiconductor layer 10n in FIG. 12, the end portion 21a of the first layer 21 may be positioned inward of the outer edge of the surface 10b of the first semiconductor layer 10n.

Figure 13:
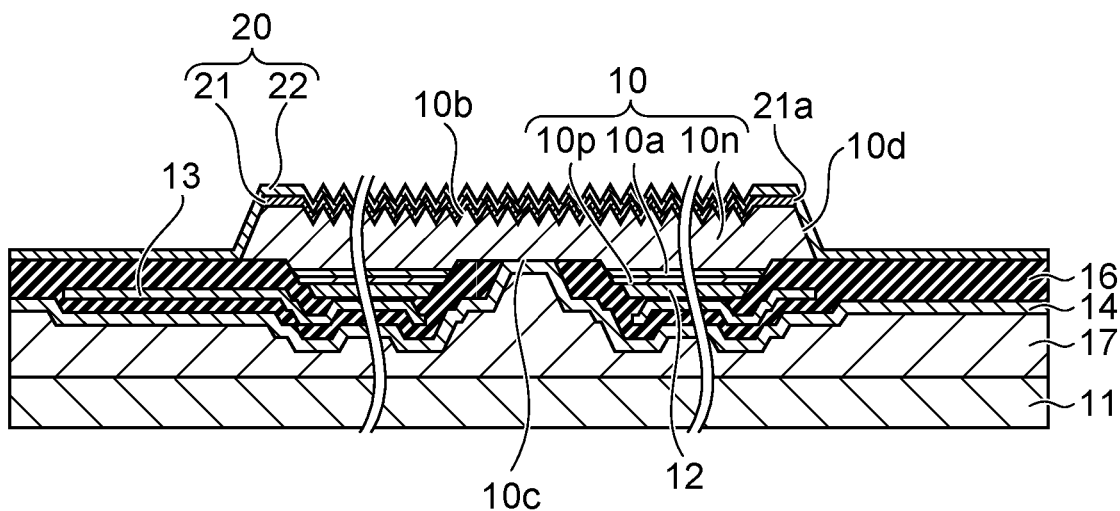

Then, as shown in FIG. 13, the second layer 22 is formed on the first layer 21 to cover the end portion 21a of the first layer 21 and the side surface 10d of the semiconductor stacked body 10. The film formation conditions of the first and second layers 21 and 22 are the same conditions as those of the first embodiment. The second layer 22 is formed also on the upper surface of the insulating layer 16 positioned at the region of the periphery of the semiconductor stacked body 10.

Figure 14:
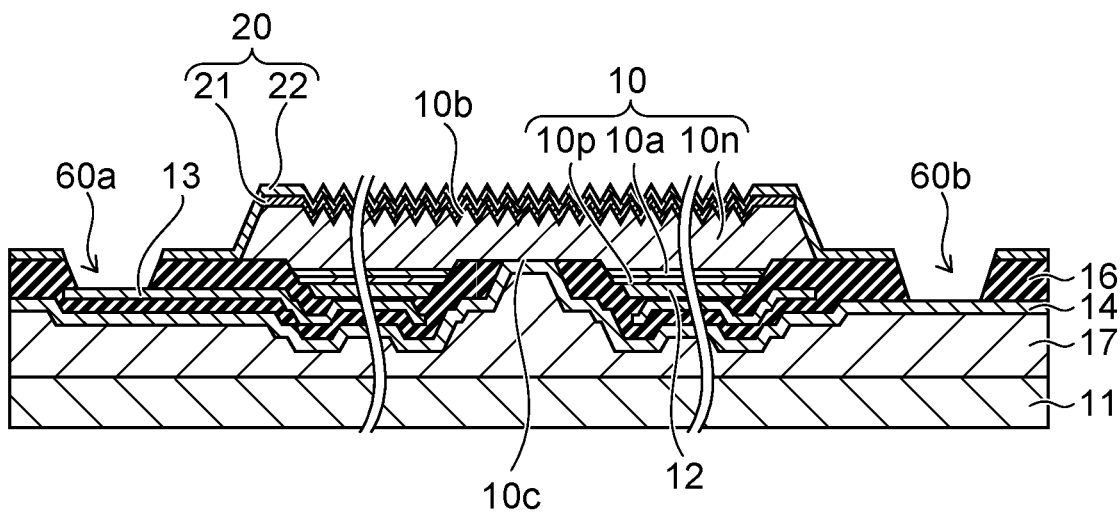

After forming the second layer 22, a first opening 60a that reaches the first wiring 13 and a second opening 60b that reaches the second wiring 14 are formed in a portion of the protective film 20 and a portion of the insulating layer 16 positioned at regions of the periphery of the semiconductor stacked body 10 as shown in FIG. 14. Subsequently, the first pad electrode 15p that is connected with the first wiring 13 is formed in the first opening 60a, and the second pad electrode 15n that is connected with the second wiring 14 is formed in the second opening 60b.

There is a tendency for the first layer 21 to have a lower density than the second layer 22 and a faster etching rate than the second layer 22. When the first layer 21 is formed on the insulating layer 16, it is necessary to partially remove the first layer 21 in the regions at which the first opening 60a and the second opening 60b are formed. When performing wet etching using a chemical liquid, there is a risk that side etching may progress to the first layer 21, and the chemical liquid may reach the semiconductor stacked body 10. When dry etching is performed, process control is difficult because the second layer 22 and the first layer 21 that have mutually-different film properties (e.g., densities) are etched in order. According to the second embodiment, the first layer 21 is not formed in the regions at which the first opening 60a and the second opening 60b are formed; therefore, the penetration of the chemical liquid into the semiconductor stacked body 10 is suppressed, and the process control is easier.

Hereinabove, exemplary embodiments of the invention are described with reference to specific examples. However, the invention is not limited to these specific examples. Appropriate design modifications of embodiments described above made by one skilled in the art also are within the scope of the invention to the extent that the features of the invention are included. For example, the content, configurations, dimensions, material properties, arrangements, conditions, etc., of the components and processes included in light-emitting elements and methods for manufacturing light-emitting elements are not limited to those illustrated, and can be modified as appropriate.

Furthermore, the components and processes according to embodiments described above can be combined within the limits of technical feasibility and are within the scope of the invention to the extent that the features of the invention are included.

What is claimed is:

1. A method for manufacturing a light-emitting element, the method comprising:
    providing a semiconductor stacked body comprising a first semiconductor layer, an active layer, and a second semiconductor layer, formed in this order on a substrate;
    exposing a surface of the first semiconductor layer by removing the substrate; and
    forming a protective film on the surface of the first semiconductor layer by performing steps comprising:
        forming a first layer on the surface of the first semiconductor layer by chemical vapor deposition while introducing a source gas to a film formation chamber at a first flow rate, and
        forming a second layer on the first layer by chemical vapor deposition while introducing a source gas to the film formation chamber at a second flow rate, the second flow rate being less than the first flow rate.

2. The method according to claim 1, wherein:
    the first layer is formed while applying a first electrical power to the semiconductor stacked body side,
    the second layer is formed while applying a second electrical power to the semiconductor stacked body side, the second electrical power being greater than the first electrical power.

3. The method according to claim 2, wherein:
    the first layer is formed while applying a first pressure in the film formation chamber,
    the second layer is formed while applying a second pressure in the film formation chamber, the second pressure being less than the first pressure.

4. The method according to claim 1, wherein:
    the first flow rate is not less than 2 times the second flow rate.

5. The method according to claim 1, wherein:
    a thickness of the first layer is less than a thickness of the second layer.

6. The method according to claim 1, wherein:
    a density of the first layer is less than a density of the second layer.

7. The method according to claim 1, wherein:
    the first layer is a silicon oxide film, and
    the second layer is a silicon oxide film or an aluminum nitride film.

8. The method according to claim 1, wherein:
    the semiconductor stacked body comprises $In_xAl_yGa_{1-x-y}N$ ($0 \leq x \leq 1$, $0 \leq y \leq 1$, and $x+y \leq 1$).

9. The method according to claim 1, further comprising:
    after the step of forming the first layer, dividing the semiconductor stacked body into a plurality of semiconductor parts and exposing a side surface of the semiconductor stacked body,
    wherein, in the step of forming the second layer, the second layer is formed on the first layer so as to cover an end portion of the first layer and the side surface of the semiconductor stacked body.

10. The method according to claim 9, further comprising:
    before the step of forming the first layer, forming an uneven surface by roughening at least a portion of the surface of the first semiconductor layer,
    wherein, in the step of forming the first layer, the first layer is formed to cover the uneven surface.

11. A method for manufacturing a light-emitting element, the method comprising:
    providing a semiconductor stacked body comprising a first semiconductor layer, an active layer, and a second semiconductor layer, formed in this order on a substrate;
    exposing a surface of the first semiconductor layer by removing the substrate; and
    forming a protective film on the surface of the first semiconductor layer by performing steps comprising
        forming a first layer on the surface of the first semiconductor layer by chemical vapor deposition while applying a first electrical power to the semiconductor stacked body side, and
        forming a second layer on the first layer by chemical vapor deposition while applying a second electrical power to the semiconductor stacked body side, the second electrical power being greater than the first electrical power.

12. The method according to claim 11, wherein:
    the first electrical power is not more than 0.5 times the second electrical power.

13. The method according to claim 11, wherein:
    a thickness of the first layer is less than a thickness of the second layer.

14. The method according to claim 11, further comprising:
    after the step of forming the first layer, dividing the semiconductor stacked body into a plurality of semiconductor parts and exposing a side surface of the semiconductor stacked body,
    wherein, the step of forming the first layer, the second layer is formed on the first layer so as to cover an end portion of the first layer and the side surface of the semiconductor stacked body.

15. The method according to claim 14, further comprising:
    before the step of forming the first layer, forming an uneven surface by roughening at least a portion of the surface of the first semiconductor layer,
    wherein, in the step of forming the first layer, the first layer is formed to cover the uneven surface.

16. A method for manufacturing a light-emitting element, the method comprising:
    providing a semiconductor stacked body comprising a first semiconductor layer, an active layer, and a second semiconductor layer formed in this order on a substrate;
    exposing a surface of the first semiconductor layer by removing the substrate; and
    forming a protective film on the surface of the first semiconductor layer by performing steps comprising
        forming a first layer on the surface of the first semiconductor layer by chemical vapor deposition while applying a first pressure in a film formation chamber, and
        forming a second layer on the first layer by chemical vapor deposition while applying a second pressure in the film formation chamber, the second pressure being less than the first pressure.

17. The method according to claim 16, wherein:
    the first pressure is not less than 2 times the second pressure.

18. The method according to claim 16, wherein:
    a thickness of the first layer is less than a thickness of the second layer.

19. The method according to claim 16, further comprising:
- after the step of forming the first layer, dividing the semiconductor stacked body into a plurality of semiconductor parts and exposing a side surface of the semiconductor stacked body,
- wherein, in the step of forming the second layer, the second layer is formed on the first layer so as to cover an end portion of the first layer and the side surface of the semiconductor stacked body.

20. The method according to claim 19, further comprising:
- before the step of forming the first layer, forming an uneven surface by roughening at least a portion of the surface of the first semiconductor layer,
- wherein, in the step of forming the first layer, the first layer is formed to cover the uneven surface.

\* \* \* \* \*